US010312362B2

United States Patent
Yamada et al.

(10) Patent No.: US 10,312,362 B2
(45) Date of Patent: Jun. 4, 2019

(54) SWITCHING ELEMENT HAVING INCLINED BODY LAYER SURFACES

(71) Applicant: TOYOTA JIDOSHA KABUSHIKI KAISHA, Toyota-shi, Aichi-ken (JP)

(72) Inventors: Tetsuya Yamada, Seto (JP); Takashi Okawa, Nisshin (JP); Tomohiko Mori, Nagakute (JP); Hiroyuki Ueda, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/833,938

(22) Filed: Dec. 6, 2017

(65) Prior Publication Data

US 2018/0182883 A1    Jun. 28, 2018

(30) Foreign Application Priority Data

Dec. 27, 2016    (JP) .................... 2016-253898

(51) Int. Cl.
*H01L 29/78* (2006.01)
*H01L 29/06* (2006.01)
*H01L 29/10* (2006.01)
*H01L 29/16* (2006.01)
*H01L 29/20* (2006.01)
(Continued)

(52) U.S. Cl.
CPC ...... *H01L 29/7802* (2013.01); *H01L 21/0254* (2013.01); *H01L 21/26546* (2013.01);
(Continued)

(58) Field of Classification Search
CPC ............ H01L 29/7802; H01L 29/063; H01L 29/1095; H01L 29/1608; H01L 29/2003;
(Continued)

(56) References Cited

U.S. PATENT DOCUMENTS 5,528,058 A * 6/1996 Pike, Jr. ............... H01L 21/033
                                                        257/142
6,365,932 B1 * 4/2002 Kouno ............... H01L 27/0255
                                                        257/133
(Continued)

FOREIGN PATENT DOCUMENTS

EP          1965436 A2    9/2008
JP       2000-106428 A    4/2000
(Continued)

OTHER PUBLICATIONS

U.S. Appl. No. 15/842,249, filed Dec. 14, 2017 in the name of Yamada et al.
Oct. 2, 2018 Office Action Issued in U.S. Appl. No. 15/842,249.

*Primary Examiner* — Ida M Soward
(74) *Attorney, Agent, or Firm* — Oliff PLC

(57) ABSTRACT

A switching element includes a semiconductor substrate that includes a first n-type semiconductor layer, a p-type body layer constituted by an epitaxial layer, and a second n-type semiconductor layer separated from the first n-type semiconductor layer by the body layer, a gate insulating film that covers a range across the surface of the first n-type semiconductor layer, the surface of the body layer, and the surface of the second n-type semiconductor layer, and a gate electrode that faces the body layer through the gate insulating film. An interface between the first n-type semiconductor layer and the body layer includes an inclined surface. The inclined surface is inclined such that the depth of the body layer increases as a distance from an end of the body layer increases in a horizontal direction. The inclined surface is disposed below the gate electrode.

3 Claims, 7 Drawing Sheets

(51) Int. Cl.

| | |
|---|---|
| *H01L 29/66* | (2006.01) |
| *H01L 23/535* | (2006.01) |
| *H01L 21/306* | (2006.01) |
| *H01L 21/02* | (2006.01) |
| *H01L 21/265* | (2006.01) |
| *H01L 21/768* | (2006.01) |
| *H01L 21/308* | (2006.01) |
| *H01L 29/739* | (2006.01) |

(52) U.S. Cl.
CPC ...... *H01L 21/308* (2013.01); *H01L 21/30612* (2013.01); *H01L 21/30625* (2013.01); *H01L 21/76805* (2013.01); *H01L 21/76895* (2013.01); *H01L 23/535* (2013.01); *H01L 29/063* (2013.01); *H01L 29/1095* (2013.01); *H01L 29/1608* (2013.01); *H01L 29/2003* (2013.01); *H01L 29/66068* (2013.01); *H01L 29/66522* (2013.01); *H01L 29/66712* (2013.01); *H01L 29/66333* (2013.01); *H01L 29/7395* (2013.01)

(58) Field of Classification Search
CPC ......... H01L 29/66068; H01L 29/66522; H01L 29/66712; H01L 23/535
See application file for complete search history.

(56) References Cited

U.S. PATENT DOCUMENTS

| | | | |
|---|---|---|---|
| 7,029,969 B2 | 4/2006 | Tarui et al. | |
| 8,963,218 B2 * | 2/2015 | Sobti | H01L 29/42368 257/263 |
| 9,070,765 B2 * | 6/2015 | Finney | H01L 29/66681 |
| 9,799,734 B2 * | 10/2017 | Ishigaki | H01L 29/7805 |
| 2004/0157355 A1 | 8/2004 | Kachi et al. | |
| 2004/0188755 A1 | 9/2004 | Tarui et al. | |
| 2010/0087039 A1 * | 4/2010 | Hshieh | H01L 29/0878 438/270 |
| 2010/0148174 A1 | 6/2010 | Nakahata et al. | |
| 2012/0187479 A1 * | 7/2012 | Guarnera | H01L 29/0634 257/334 |
| 2012/0273871 A1 * | 11/2012 | Yedinak | H01L 29/872 257/329 |
| 2015/0034964 A1 | 2/2015 | Takeya et al. | |
| 2015/0097226 A1 * | 4/2015 | Lichtenwalner | H01L 29/4925 257/329 |
| 2015/0171016 A1 * | 6/2015 | Okuno | H01L 23/53219 257/77 |
| 2015/0294865 A1 | 10/2015 | Tsai et al. | |
| 2016/0043199 A1 * | 2/2016 | Sumi | H01L 29/66712 438/268 |
| 2017/0200819 A1 | 7/2017 | Sugimoto et al. | |
| 2018/0182621 A1 | 6/2018 | Yamada et al. | |
| 2018/0182883 A1 | 6/2018 | Yamada et al. | |

FOREIGN PATENT DOCUMENTS

| | | |
|---|---|---|
| JP | 2002-158353 A | 5/2002 |
| JP | 2007-281086 A | 10/2007 |
| JP | 2009-147381 A | 7/2009 |
| JP | 2016-039263 A | 3/2016 |

* cited by examiner

SWITCHING ELEMENT HAVING INCLINED BODY LAYER SURFACES

INCORPORATION BY REFERENCE

The disclosure of Japanese Patent Application No. 2016-253898 filed on Dec. 27, 2016 including the specification, drawings and abstract is incorporated herein by reference in its entirety.

BACKGROUND

1. Technical Field

The present disclosure relates to a switching element and a method of manufacturing a switching element.

2. Description of Related Art

Japanese Unexamined Patent Application Publication No. 2009-147381 (JP 2009-147381 A) discloses a switching element that includes a first n-type semiconductor layer (drift region), a p-type body layer, and a second n-type semiconductor layer (source region). The second n-type semiconductor layer is separated from the first n-type semiconductor layer by the body layer. A gate electrode faces the body layer, which is in a range separating the first n-type semiconductor layer and the second n-type semiconductor layer from each other, through a gate insulating film. In the switching element, an interface between the first n-type semiconductor layer and the body layer has an inclined surface which is inclined so that the depth of the body layer becomes increases as a distance from the end of the body layer increases. The inclined surface is disposed below the gate electrode.

SUMMARY

As a result of researching, the inventors have found that an electric field to be applied to the gate insulating film can be attenuated by providing the inclined surface on the interface between the body layer below the gate electrode and the first n-type semiconductor layer.

In the switching element disclosed in JP 2009-147381 A, the inclined surface is provided on the interface between the body layer below the gate electrode and the first n-type semiconductor layer. However, in JP 2009-147381 A, the body layer is constituted by a diffusion layer. In a case where the body layer is constituted by a diffusion layer, impurities are diffused toward the first n-type semiconductor layer side from the body layer side, and thus the inclined surface has a curved shape so as to protrude toward the first n-type semiconductor layer side. In this manner, when the inclined surface is curved, the inclined surface becomes relatively narrow, and an effect of attenuating an electric field to be applied to the gate insulating film is relatively decreased. Therefore, in this specification, a switching element capable of more effectively attenuating an electric field to be applied to the gate insulating film is provided.

A first aspect of the present disclosure relates to a switching element including a semiconductor substrate, a gate insulating film, and a gate electrode. The semiconductor substrate includes a first n-type semiconductor layer exposed to a surface of the semiconductor substrate, a p-type body layer constituted by an epitaxial layer exposed to the surface of the semiconductor substrate, and a second n-type semiconductor layer exposed to the surface of the semiconductor substrate and separated from the first n-type semiconductor layer by the body layer. The gate insulating film is configured to cover a range across a surface of the first n-type semiconductor layer, a surface of the body layer between the first n-type semiconductor layer and the second n-type semiconductor layer, and a surface of the second n-type semiconductor layer. The gate electrode is configured to face the body layer between the first n-type semiconductor layer and the second n-type semiconductor layer through the gate insulating film. An interface between the first n-type semiconductor layer and the body layer includes an inclined surface, the inclined surface is inclined such that a depth of the body layer increases as a distance from an end of the body layer increases in a horizontal direction, and the inclined surface is disposed below the gate electrode.

In the switching element according to the first aspect of the present disclosure, an interface between the body layer below the gate electrode and the first n-type semiconductor layer is provided with an inclined surface. In addition, in the switching element, the body layer is constituted by an epitaxial layer, and diffusion of impurities to the first n-type semiconductor layer side from the body layer side hardly occurs. Therefore, with the structure of the switching element, it is possible to provide an inclined surface which is hardly curved on the interface between the body layer and the first n-type semiconductor layer and to obtain a relatively wide inclined surface. Therefore, with the structure, it is possible to effectively attenuate an electric field to be applied to the gate insulating film.

In the switching element according to the first aspect of the present disclosure, an angle of the inclined surface with respect to the surface of the semiconductor substrate may be less than 60°.

In the switching element according to the first aspect of the present disclosure, the interface may include a surface layer portion interface extending downward from the surface of the semiconductor substrate below the gate electrode and having an angle with respect to the surface of the semiconductor substrate being equal to or greater than 80° and equal to or less than 90°, the inclined surface may be positioned on a lower side of the surface layer portion interface, and an angle of the inclined surface with respect to the surface of the semiconductor substrate may be less than 60°.

In the switching element according to the first aspect of the present disclosure, the semiconductor substrate may include at least two body layers and two second n-type semiconductor layers, and the gate insulating film may cover a range across a surface of a spacing portion which is a portion positioned between the two body layers in the first n-type semiconductor layer, the surface of the body layer which is a portion positioned between the spacing portion and the second n-type semiconductor layer, and a portion of the surface of the second n-type semiconductor layer.

A second aspect of the present disclosure relates to a method of manufacturing a switching element, the switching element including a semiconductor substrate that includes a first n-type semiconductor layer exposed to a surface of a semiconductor substrate, a p-type body layer, and a second n-type semiconductor layer exposed to the surface of the semiconductor substrate and separated from the first n-type semiconductor layer by the body layer, a gate insulating film, and a gate electrode that faces the body layer between the first n-type semiconductor layer and the second n-type semiconductor layer through the gate insulating film. The method includes forming a mask in which an opening is provided in an upper surface of the semiconductor substrate; etching the upper surface of the semiconductor substrate of the opening to form a concave portion, and forming the concave portion such that a side surface of the concave portion serves as an inclined surface inclined such that a depth of the concave portion increases as a distance from an end of the concave portion increases toward a horizontal direction, with respect to the upper surface of the semiconductor substrate in the etching; removing the mask; epitaxially growing the body layer on the upper surface of the semiconductor substrate and within the concave portion by epitaxial growth; polishing the upper surface of the semiconductor substrate; selectively injecting n-type impurity ions into a portion of the body layer to form the second n-type semiconductor layer; forming the gate insulating film so as to cover a range across a surface of the first n-type semiconductor layer, a surface of the body layer between the first n-type semiconductor layer and the second n-type semiconductor layer, and a surface of the second n-type semiconductor layer; forming the gate electrode so as to cover entirety of an upper surface of the gate insulating film; forming an interlayer insulating film so as to cover the surface of the semiconductor substrate and a surface of the gate electrode; forming a contact plug within a contact hole provided in the interlayer insulating film; disposing an upper electrode on an upper surface of the interlayer insulating film; and disposing a lower electrode on a surface opposite to a surface on which the interlayer insulating film is formed in the semiconductor substrate.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
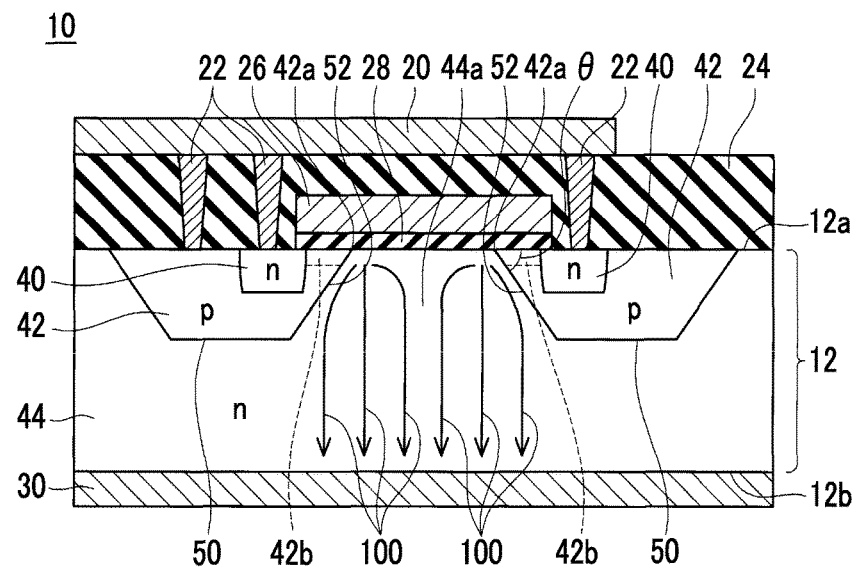
FIG. 1 is a cross-sectional view of a MOSFET according to Example 1.

A MOSFET 10 illustrated in FIG. 1 includes a GaN semiconductor substrate 12. The GaN semiconductor substrate 12 is a semiconductor substrate containing a gallium nitride (GaN) as a main component.

The GaN semiconductor substrate 12 includes a plurality of source layers 40, a plurality of body layers 42, and a drift layer 44.

Each of the source layers 40 is an n-type region, and is exposed to an upper surface 12a of the GaN semiconductor substrate 12.

Each of the body layers 42 is a p-type region, and is disposed in the vicinity of the corresponding source layer 40. Each of the body layers 42 covers the side surface and the lower surface of the corresponding source layer 40. Each of the body layers 42 is exposed to the upper surface 12a of the GaN semiconductor substrate 12 in a range adjacent to the source layer 40.

The drift layer 44 is an n-type region, and is disposed under the body layers 42. In addition, the drift layer 44 is also disposed between a pair of body layers 42. Hereinafter, a portion of the drift layer 44 which is positioned between the body layers 42 is referred to as a spacing portion 44a. The spacing portion 44a may be referred to as a JFET region. The spacing portion 44a is exposed to the upper surface 12a of the GaN semiconductor substrate 12. In addition, the drift layer 44 is exposed to substantially the entire region of a lower surface 12b of the GaN semiconductor substrate 12. The drift layer 44 is separated from each source layer 40 by each body layer 42.

An interface 50 between the body layer 42 and the drift layer 44 is a pn junction surface. An inclined surface 52 is provided in the interface 50 which is a portion between the body layer 42 and the spacing portion 44a. The inclined surface 52 extends obliquely downward from the upper surface 12a of the GaN semiconductor substrate 12. The inclined surface 52 extends to the bottom surface of the body layer 42. The inclined surface 52 is inclined to the upper surface 12a so that the depth (that is, a distance between the upper surface 12a and the lower end of the body layer 42) of the body layer 42 increases as a distance from an end 42a of the body layer 42 increases along the horizontal direction (direction parallel to the upper surface 12a). An angle θ (angle measured within the body layer 42) between the inclined surface 52 and the upper surface 12a is less than 60°. In the bottom of the body layer 42, the interface 50 extends substantially in parallel with the upper surface 12a.

A gate insulating film 28, a gate electrode 26, an interlayer insulating film 24, a contact plug 22, and an upper electrode 20 are disposed on the upper surface 12a of the GaN semiconductor substrate 12.

The gate insulating film 28 covers a portion of the upper surface 12a of the GaN semiconductor substrate 12. The gate insulating film 28 covers a range across the surface of the source layer 40 in the vicinity of the body layer 42, the surface of the body layer 42 between the source layer 40 and the spacing portion 44a, and the surface of the spacing portion 44a. A portion (that is, a surface layer portion of the body layer 42 between the source layer 40 and the spacing portion 44a), which is in contact with the gate insulating film 28 in each body layer 42, is a channel region 42b in which a channel is formed. The gate insulating film 28 is constituted by an insulator such as an oxide silicon.

The gate electrode 26 is disposed on the gate insulating film 28. The gate electrode 26 faces the source layer 40, the body layer 42 (that is, the channel region 42b) and the drift layer 44 (that is, the spacing portion 44a) through the gate insulating film 28. The gate electrode 26 is insulated from the GaN semiconductor substrate 12 by the gate insulating film 28.

The interlayer insulating film 24 covers the upper surface 12a in a range which is not covered with the gate insulating film 28. In addition, the interlayer insulating film 24 covers the surface of the gate electrode 26. The interlayer insulating film 24 is constituted by an insulator such as an oxide silicon.

The interlayer insulating film 24 is provided with a plurality of contact holes, and the contact plug 22 is provided within each of the contact holes. Some of the contact plugs 22 are connected to the source layer 40 at the lower end thereof, and the other contact plugs 22 are connected to the body layer 42 at the lower end thereof.

The upper electrode 20 is disposed on the interlayer insulating film 24. The upper electrode 20 is in contact with the upper surface of each contact plug 22. The upper electrode 20 is connected to the source layer 40 and the body layer 42 through the contact plug 22.

A lower electrode 30 is disposed on the lower surface 12b of the GaN semiconductor substrate 12. The lower electrode 30 is connected to the drift layer 44.

When the potential of the gate electrode 26 increases to equal to or greater than a gate threshold value (a minimum gate potential needed for the turn-on of the MOSFET 10), electrons are drawn to the channel region 42b of the body layer 42, and thus a channel is formed in the channel region 42b. The source layer 40 and the drift layer 44 are connected to each other through the channel, and thus the electrons flow to the drift layer 44 from the source layer 40. In the MOSFET 10, the channel region 42b (that is, body layer 42) is an epitaxial layer, and thus there are few crystal defects in the channel region 42b. Therefore, the MOSFET 10 has relatively low on-resistance.

In addition, in the MOSFET 10, the interface 50 in a portion positioned below the channel region 42b serves as the inclined surface 52. For this reason, the electrons having passed through the channel region 42b flow downward while being dispersed, as indicated by arrows 100 in FIG. 1. Accordingly, the on-resistance of the MOSFET 10 is further decreased.

When the potential of the gate electrode 26 is reduced to less than the gate threshold value, the channel disappears, and the flow of the electrons is stopped. That is, the MOSFET 10 is turned off. When the MOSFET 10 is turned off, a reverse voltage (that is, a voltage allowing the drift layer 44 to have a potential higher than that of the body layer 42) is applied to a pn junction of the interface 50. For this reason, a depletion layer expands from the body layer 42 to the drift layer 44, and thus the drift layer 44 is depleted. When the drift layer 44 is depleted, a potential distribution is generated inside the drift layer 44. The potential distribution is generated across the drift layer 44 and the gate insulating film 28. For this reason, an electric field is applied across the drift layer 44 and the gate insulating film 28.

Figure 2:
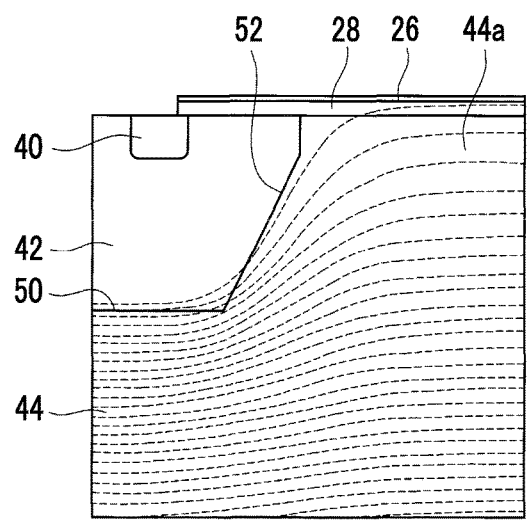
FIG. 2 is a diagram illustrating the distribution of an electric field of a MOSFET having a relatively wide inclined surface.
Figure 3:
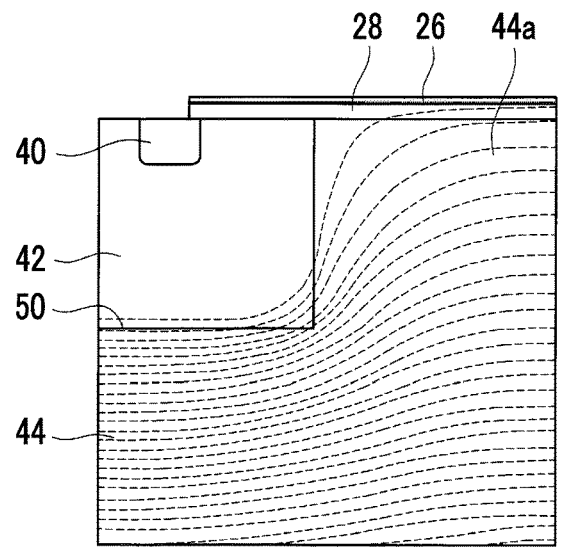
FIG. 3 is a diagram illustrating the distribution of an electric field of a MOSFET according to Comparative Example 1.
Figure 4:
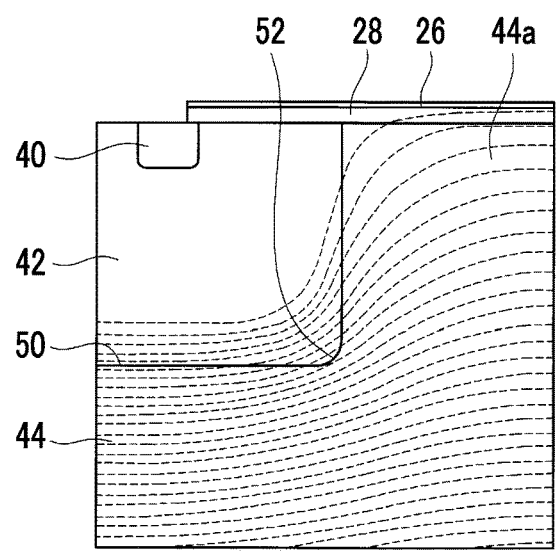
FIG. 4 is a diagram illustrating the distribution of an electric field of a MOSFET according to Comparative Example 2.

FIGS. 2 to 4 illustrate results obtained by calculating a potential distribution in an off-state of a MOSFET through a simulation. In FIGS. 2 to 4, a dashed line indicates an equipotential line. Meanwhile, FIG. 2 illustrates a potential distribution in a MOSFET having a relatively wide inclined surface 52 and obtained by imitating Example 1, and FIGS. 3 and 4 respectively illustrate potential distributions in MOSFETs according to Comparative Examples 1 and 2. In the MOSFET according to Comparative Example 1 illustrated in FIG. 3, the interface 50 does not have the inclined surface 52, and the interface 50 between the body layer 42 and the spacing portion 44a extends so as to be substantially perpendicular to the upper surface 12a. In the MOSFET according to Comparative Example 2 illustrated in FIG. 4, although the interface 50 has the inclined surface 52, the inclined surface 52 is curved so as to protrude toward the drift layer 44 side, and the inclined surface 52 is relatively narrow. In a case where the body layer 42 is constituted by a diffusion layer, p-type impurities are dispersed toward the drift layer 44 from the body layer 42 at the time of activating impurities even when the relatively wide inclined surface 52 is provided at a stage of injecting the impurities, and thus the inclined surface 52 is curved toward the drift layer 44. As a result, as illustrated in FIG. 4, the inclined surface 52 becomes relatively narrow. In FIGS. 3 and 4, an interval between the equipotential lines in the vicinity of the gate insulating film 28 on the spacing portion 44a becomes smaller than that in FIG. 2. From FIGS. 2 to 4, it can be understood that an electric field applied to the gate insulating film 28 is attenuated when the inclined surface 52 is relatively wide as illustrated in FIG. 2.

Figure 5:
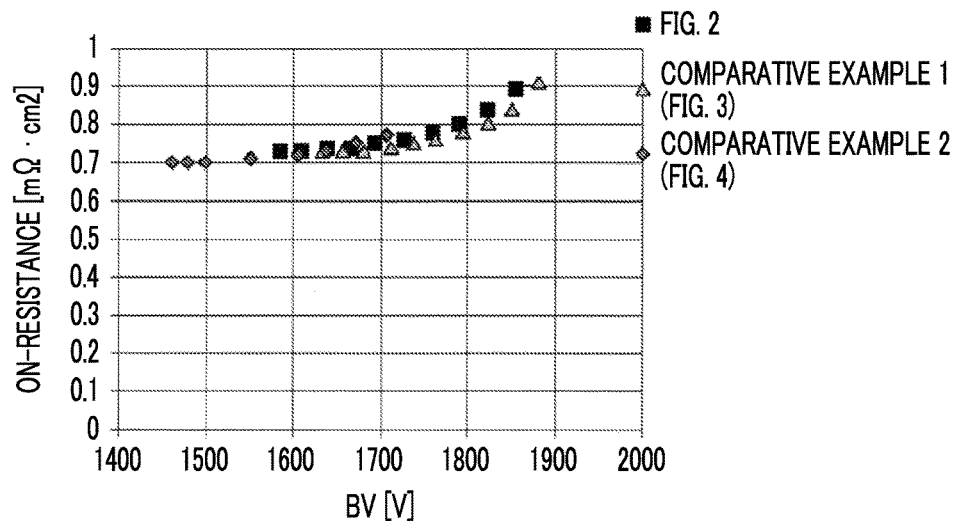
FIG. 5 is a graph illustrating comparison of on-resistance.
Figure 6:
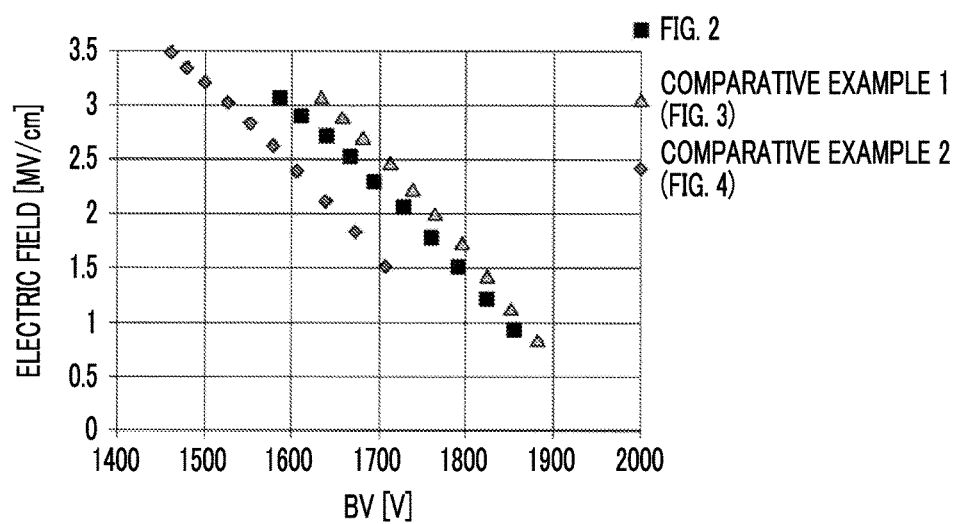
FIG. 6 is a graph illustrating comparison of an electric field to be applied to a gate insulating film.

In addition, FIGS. 5 and 6 illustrate comparison between characteristics of the MOSFET in FIG. 2 and the MOSFETs according to the Comparative Examples 1 and 2 (FIGS. 3 and 4). FIG. 5 illustrates a relationship between a drain-source voltage BV and on-resistance. FIG. 6 illustrates a relationship between a drain-source voltage BV and an electric field to be applied to an oxide film. From FIG. 5, it can be understood that the MOSFET in FIG. 2 can obtain on-resistance equal to those of the MOSFETs according to Comparative Examples 1 and 2. In addition, from FIG. 6, it can be understood that an electric field to be applied to the gate insulating film 28 in the MOSFET in FIG. 2 is lower than those in the MOSFETs according to Comparative Examples 1 and 2 in a case where drain and source voltages are equal to each other. From the above-described results, according to the MOSFET 10 having the relatively wide inclined surface 52 in Example 1, it is possible to more suppress an electric field to be applied to the gate insulating film 28 than that in the MOSFETs according to Comparative Examples 1 and 2 while obtaining on-resistance equal to that in the MOSFETs according to Comparative Examples 1 and 2.

Figure 7:
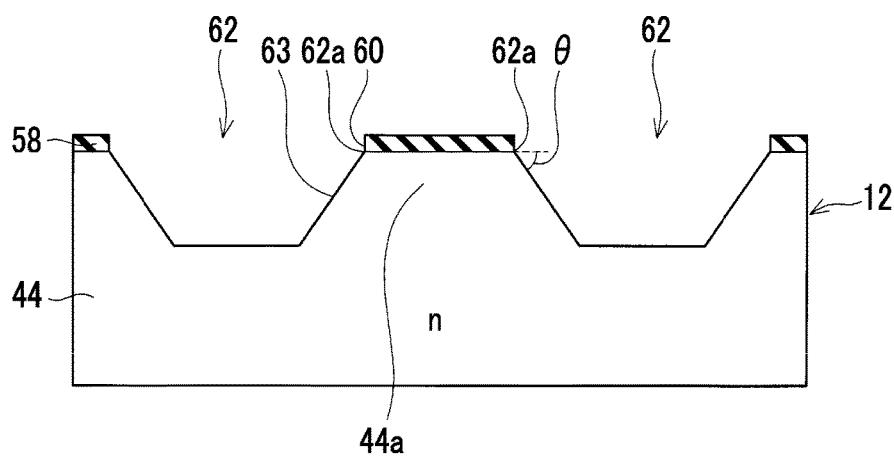
FIG. 7 is a diagram illustrating a MOSFET manufacturing process according to Example 1.

Next, a method of manufacturing the MOSFET 10 in Example 1 will be described. First, as illustrated in FIG. 7, a mask 58 in which an opening 60 is provided is formed in the upper surface 12a of the GaN semiconductor substrate 12. Next, the upper surface of the GaN semiconductor substrate 12 within the opening 60 is etched to form a concave portion 62. At this time, the concave portion 62 is formed so that the side surface of the concave portion 62 serves as an inclined surface 63 which is inclined to the upper surface of the GaN semiconductor substrate 12 (in more detail, which is inclined so that the depth of the concave portion 62 increases as a distance from an end 62a of the concave portion 62 increases) by adjusting etching conditions. For example, it is possible to form the inclined surface 63 by reducing the thickness of the mask 58 as a distance to the opening 60 decreases and further reducing a difference in etching rate between the mask 58 and the GaN semiconductor substrate 12 by adjusting conditions such as a gas type, a pressure, and an RF power. Here, the concave portion 62 is formed so that an angle θ between the inclined surface 63 and the upper surface of the GaN semiconductor substrate 12 is set to be less than 60°.

Figure 8:
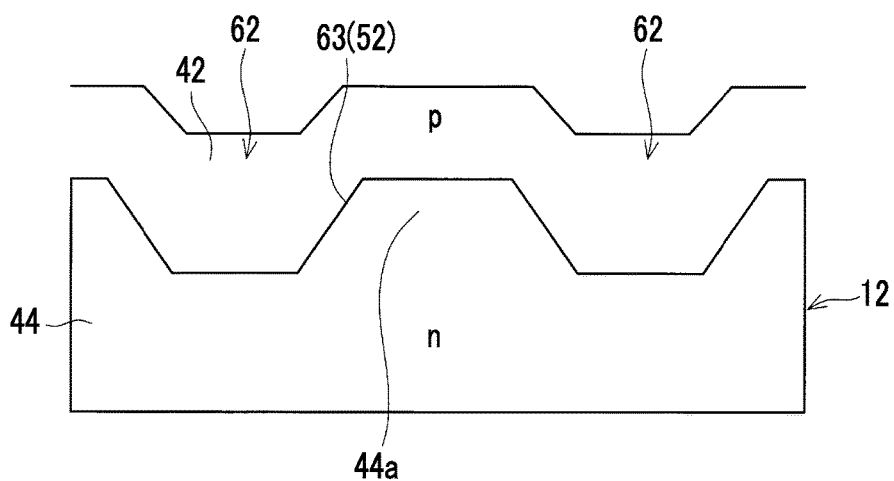
FIG. 8 is a diagram illustrating the MOSFET manufacturing process according to Example 1.

Next, the mask 58 is removed, and the body layer 42 which is a p-type GaN semiconductor layer is epitaxially grown on the upper surface of the GaN semiconductor substrate 12 and inside the concave portion 62 by epitaxial growth as illustrated in FIG. 8. Hereinafter, the entire GaN semiconductor layer including the drift layer 44 and the body layer 42 is referred to as the GaN semiconductor substrate 12.

Figure 9:
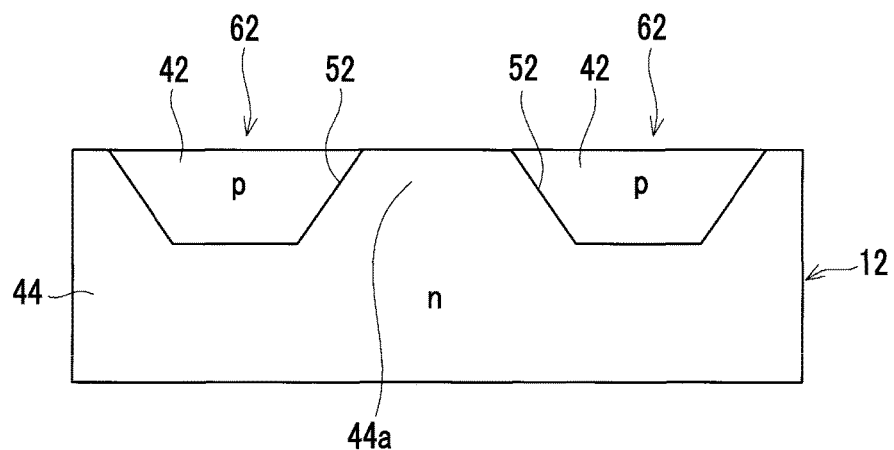
FIG. 9 is a diagram illustrating the MOSFET manufacturing process according to Example 1.

Next, the upper surface (that is, the surface of the body layer 42) of the GaN semiconductor substrate 12 is polished by Chemical Mechanical Polishing (CMP). Here, as illustrated in FIG. 9, the spacing portion 44*a* of the drift layer 44 is exposed to the upper surface of the GaN semiconductor substrate 12. In addition, the body layer 42 is left inside the concave portion 62.

Figure 10:
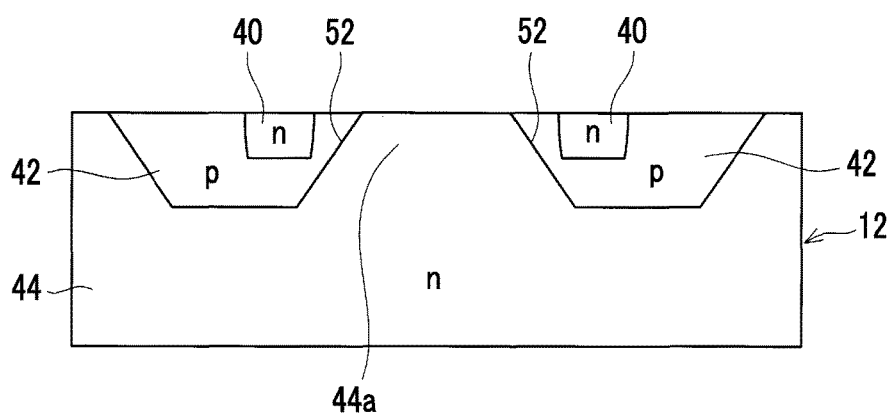
FIG. 10 is a diagram illustrating the MOSFET manufacturing process according to Example 1.

Next, as illustrated in FIG. 10, n-type impurity ions are selectively injected into a portion of the body layer 42 to form the source layer 40.

Figure 11:
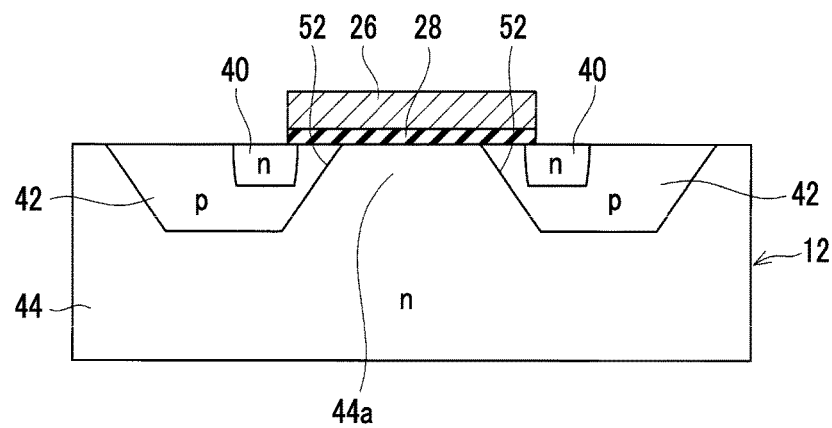
FIG. 11 is a diagram illustrating the MOSFET manufacturing process according to Example 1.

Next, as illustrated in FIG. 11, the gate insulating film 28 is formed. The gate insulating film 28 is formed so as to cover a range across the surface of the source layer 40 in the vicinity of the body layer 42, the surface of the body layer 42 between the source layer 40 and the spacing portion 44*a*, and the surface of the spacing portion 44*a*. Next, as illustrated in FIG. 11, the gate electrode 26 is formed so as to cover the entire upper surface of the gate insulating film 28. Thereafter, the interlayer insulating film 24, the contact plug 22, the upper electrode 20, and the lower electrode 30 are formed, thereby completing the MOSFET 10 illustrated in FIG. 1.

As described above, in the MOSFET 10 according to Example 1, the body layer 42 is an epitaxial layer. For this reason, when the body layer 42 is formed, p-type impurities are hardly dispersed to the drift layer 44 from the body layer 42. Therefore, it is possible to make the interface 50 have substantially the same shape as the concave portion 62. For this reason, the body layer 42 is configured as an epitaxial layer, and thus it is possible to make the inclined surface 52 have a desired shape. That is, the body layer 42 is configured as an epitaxial layer, and thus it is possible to make the inclined surface 52 become relatively wide by suppressing the curvature of the inclined surface 52. Therefore, the MOSFET 10 according to Example 1 can effectively attenuate an electric field to be applied to the gate insulating film 28.

Figure 12:
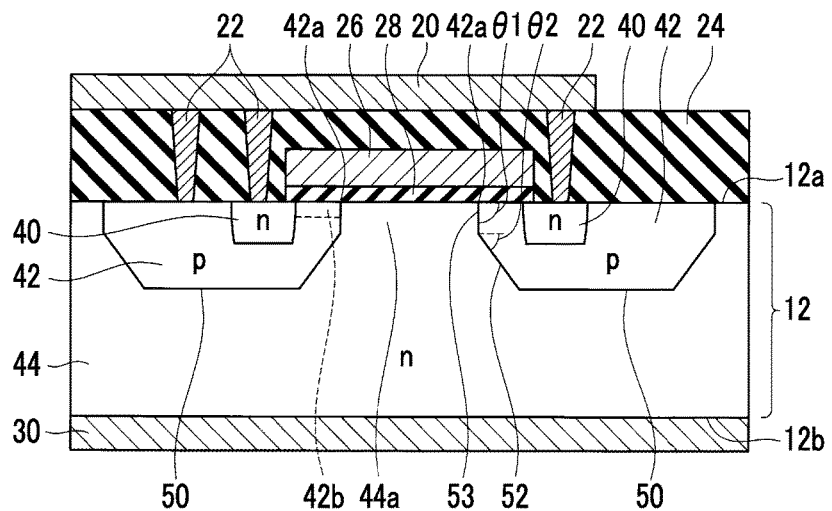
FIG. 12 is a cross-sectional view of a MOSFET according to Example 2.

A MOSFET according to Example 2 illustrated in FIG. 12 is different from the MOSFET 10 according to Example 1 in that an interface 50 between a body layer 42 and a spacing portion 44*a* (that is, a drift layer 44) has a surface layer portion interface 53 and an inclined surface 52. The other configurations of the MOSFET according to Example 2 are the same as those of the MOSFET 10 according to Example 1. The surface layer portion interface 53 is a portion of the interface 50 which is positioned in the vicinity of the upper surface 12*a*. An angle θ1 between the surface layer portion interface 53 and an upper surface 12*a* is equal to or greater than 80° and equal to or less than 90°. That is, the surface layer portion interface 53 substantially vertically extends downward from the upper surface 12*a*. The inclined surface 52 is disposed below the surface layer portion interface 53. An upper end of the inclined surface 52 is connected to a lower end of the surface layer portion interface 53. The inclined surface 52 is inclined to the upper surface 12*a* so that the depth of the body layer 42 increases as a distance from an end 42*a* of the body layer 42 increases along the horizontal direction. An angle θ2 between the inclined surface 52 and the upper surface 12*a* is less than 60°.

In the MOSFET according to Example 2, the body layer 42 is an epitaxial layer, and thus the inclined surface 52 is relatively wide. Therefore, in the MOSFET according to Example 2, an electric field to be applied to a gate insulating film 28 is attenuated.

In addition, in the MOSFET according to Example 2, the surface layer portion interface 53 is provided in the upper portion of the inclined surface 52. For this reason, in a case where the widths of the spacing portion 44*a* according to Example 1 and Example 2 are set to be the same as each other, a distance between the inclined surface 52 and a source layer 40 in Example 2 becomes larger than that in Example 1. In a state where the MOSFET is turned on, a depletion layer is locally generated in the vicinity of the interface 50 including the inclined surface 52. In the MOSFET according to Example 2, a distance between the depletion layer generated in the vicinity of the inclined surface 52 in an on-state and the source layer 40 is larger than that in the MOSFET 10 according to Example 1. For this reason, in the MOSFET according to Example 2, a short-channel effect is hardly obtained. Therefore, according to the structure in Example 2, it is possible to more suppress a variation in a gate threshold value due to a short-channel effect.

In addition, when the surface layer portion interface 53 extending so as to be substantially perpendicular to the upper surface 12*a* is provided as in Example 2, a variation is hardly caused in a width (that is, a width between the surface layer portion interfaces 53 positioned on both sides of the spacing portion 44*a* in Example 2) in the upper surface 12*a* of the spacing portion 44*a* between MOSFETs during mass production. When the width of the spacing portion 44*a* is relatively wide, a high electric field is easily applied to the gate insulating film 28 on the spacing portion 44*a*. According to the structure of the MOSFET according to Example 2, a variation in the width of the spacing portion 44*a* is suppressed, and thus it is possible to stably suppress an electric field to be applied to the gate insulating film 28.

Figure 13:
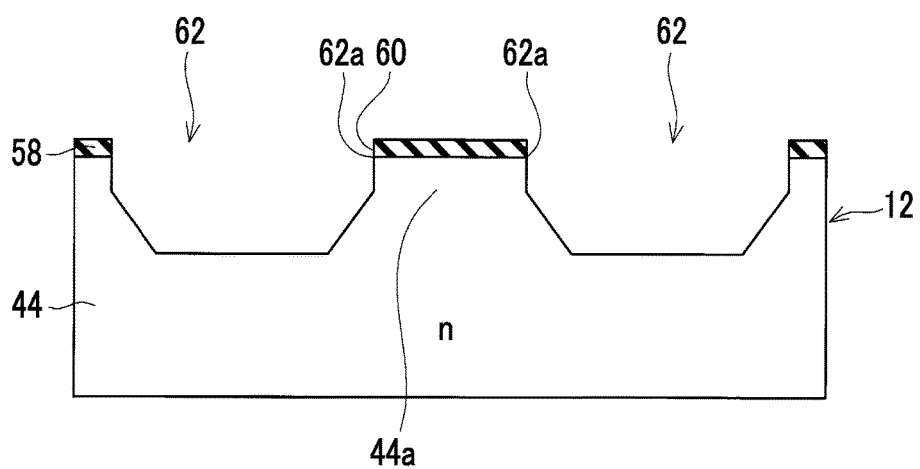
FIG. 13 is a diagram illustrating the MOSFET manufacturing process according to Example 2.

The MOSFET according to Example 2 can be manufactured by forming the concave portion 62 having a shape illustrated in FIG. 13 and then performing the same process as that in Example 1. The concave portion 62 having a shape illustrated in FIG. 13 can be obtained by first forming the concave portion 62 as in FIG. 7 similar to Example 1 and then further etching the concave portion 62 under conditions in which etching uniformly proceeds along the thickness direction of the GaN semiconductor substrate 12.

Although the MOSFET has been described in Examples 1 and 2 described above, a technique disclosed in this specification may be applied to an IGBT. It is possible to obtain the structure of the IGBT by adding a p-type layer between the lower electrode 30 and the drift layer 44.

In addition, in Examples 1 and 2 described above, the GaN semiconductor substrate has been used as a semiconductor substrate. However, a technique disclosed in this specification may be applied to a switching element including a semiconductor substrate containing SiC or Si as a main component. Here, the technique disclosed in this specification is particularly effective in a case where a semiconductor substrate hardly controlling the diffusion of impurities such as GaN or SiC is used.

A relationship between constituent elements of the examples and constituent elements of claims will be described. The drift layer 44 in the example is an example of a first n-type semiconductor layer. The source layer 40 in the example is an example of a second n-type semiconductor layer.

Technical elements of the present disclosure will be described below.

In the switching element which is an example of the present disclosure, the interface between the first n-type semiconductor layer and the body layer extends downward from the surface of the semiconductor substrate below the gate electrode, and the surface layer portion interface having an angle with respect to the surface of the semiconductor substrate being equal to or greater than 80° and equal to or less than 90°. An inclined surface is positioned on the lower side of the surface layer portion interface. An angle of the inclined surface with respect to the surface of the semiconductor substrate is less than 60°.

Meanwhile, in this specification, an angle of an interface (that is, the surface layer portion interface or the inclined surface) with respect to the surface of the semiconductor substrate means an angle which is measured within the body layer.

As described above, although the embodiments have been described in detail, these are just examples and do not limit the scope of the claims. The technique described in the claims includes various modification and changes of the specific examples described above. Technical elements described in this specification or drawings show technical utility independently or in various combinations, and are not limited to combinations described in the claims at the time of filing of this application. In addition, the technique described in this specification or drawings achieves a plurality of objects at the same time, and has technical utility even when it achieves one of the objects.

What is claimed is:

1. A switching element comprising:
    a semiconductor substrate including:
        a first n-type semiconductor layer exposed to a surface of the semiconductor substrate;
        a p-type body layer constituted by an epitaxial layer exposed to the surface of the semiconductor substrate; and
        a second n-type semiconductor layer exposed to the surface of the semiconductor substrate and separated from the first n-type semiconductor layer by the p-type body layer;
    a gate insulating film configured to cover a range across a surface of the first n-type semiconductor layer, a surface of the body layer between the first n-type semiconductor layer and the second n-type semiconductor layer, and a surface of the second n-type semiconductor layer; and
    a gate electrode configured to face the body layer between the first n-type semiconductor layer and the second n-type semiconductor layer through the gate insulating film,
    wherein an interface between the first n-type semiconductor layer and the body layer includes an inclined surface which is not curved, the inclined surface is inclined such that a depth of the body layer increases as a distance from an end of the body layer increases in a horizontal direction, and the inclined surface is disposed below the gate electrode, and
    the interface includes a surface layer portion interface vertically extending downward from the surface of the semiconductor substrate below the gate electrode, the inclined surface is positioned on a lower side of the surface layer portion interface, and an angle of the inclined surface with respect to the surface of the semiconductor substrate is less than 60°.

2. The switching element according to claim 1, wherein the surface layer portion interface has an angle with respect to the surface of the semiconductor substrate equal to or greater than 80° and equal to or less than 90°.

3. The switching element according to claim 1, wherein:
    the semiconductor substrate includes at least two body layers and two second n-type semiconductor layers, and
    the gate insulating film covers a range across a surface of a spacing portion which is a portion positioned between the two body layers in the first n-type semiconductor layer, a portion of the surface of the p-type body layer which is positioned between the spacing portion and one of the second n-type semiconductor layer, and a portion of the surface of the one second n-type semiconductor layer.

* * * * *